United States Patent
Auriel

(10) Patent No.: US 6,967,356 B2
(45) Date of Patent: Nov. 22, 2005

(54) VERTICAL COMPONENT WITH HIGH-VOLTAGE STRENGTH

(75) Inventor: Gérard Auriel, Chanceaux (FR)

(73) Assignee: STMicroelectronics S.A., Montrouge (FR)

(*) Notice: Subject to any disclaimer, the term of this patent is extended or adjusted under 35 U.S.C. 154(b) by 83 days.

(21) Appl. No.: 10/169,852

(22) PCT Filed: Oct. 11, 2001

(86) PCT No.: PCT/FR01/03150
§ 371 (c)(1),
(2), (4) Date: Oct. 15, 2002

(87) PCT Pub. No.: WO02/31885
PCT Pub. Date: Apr. 18, 2002

(65) Prior Publication Data
US 2003/0141516 A1 Jul. 31, 2003

(30) Foreign Application Priority Data
Oct. 12, 2000 (FR) .................................. 00 13077

(51) Int. Cl.⁷ ..................... H01L 29/74; H01L 31/111
(52) U.S. Cl. ................. 257/119; 257/129; 257/119; 257/168; 257/169; 257/170; 257/171
(58) Field of Search ................. 257/119, 129, 257/168–171

(56) References Cited

U.S. PATENT DOCUMENTS

| | | | |
|---|---|---|---|
| 3,362,858 A | * | 1/1968 | Knopp ................ 438/133 |
| 4,402,001 A | | 8/1983 | Momma et al. |
| 4,942,446 A | | 7/1990 | Yakushiji |
| 6,078,065 A | | 6/2000 | Streit et al. |
| 6,583,496 B2 | * | 6/2003 | Galtie et al. ................ 257/601 |
| 6,593,600 B1 | * | 7/2003 | Duclos et al. .............. 257/107 |

FOREIGN PATENT DOCUMENTS

EP    0 109 331 A1    5/1984

OTHER PUBLICATIONS

International Search Report from application No. PCT/FR 01/03150.
English translation of the International Preliminary Examination Report from priority application No. PCT/FR01/031508.

* cited by examiner

Primary Examiner—Jerome Jackson
Assistant Examiner—Joseph Nguyen
(74) Attorney, Agent, or Firm—Lisa K. Jorgenson; William R. McClellan; Wolf, Greenfield & Sacks P.C.

(57) ABSTRACT

The invention concerns a vertical component with a four-layered structure comprising a thick lightly-doped zone (1) of a first type of conductivity providing the component voltage strength, enclosed with a peripheral wall (2) of a second type of conductivity extending vertically from one surface to the other of the component, and highly doped layer (3) of the second type of conductivity extending over the entire rear surface of the component. A lightly-doped layer (21) of the second type of conductivity extends over the entire surface of the component at the interface between the lightly-doped thick zone of the first type of conductivity and the highly-doped layer of the second type of conductivity.

5 Claims, 2 Drawing Sheets

VERTICAL COMPONENT WITH HIGH-VOLTAGE STRENGTH

The present invention relates to power components and more specifically to peripheral structures providing a high breakdown voltage for the components. The present invention more specifically aims at "four-layer" components, such as thyristors or triacs with a well-type structure.

FIG. 1 is a very simplified cross-section view of a well thyristor structure formed from a lightly-doped N-type substrate 1. The thyristor is delimited by a P-type insulating wall 2. The rear surface is uniformly coated with a P-type layer 3. On the front surface side, a heavily-doped N-type region 5 forming the thyristor cathode is present in a P-type well 4. An electrode (not shown) forms one piece with layer 4 and forms the thyristor gate. An anode metallization A forms one piece with the rear surface of the component and a cathode metallization K is formed on N+-type region 5. Conventionally, region 5 is provided with emitter short-circuits, that is, the N+ layer is interrupted in places and metallization K is in contact with portions of P-type layer 4.

FIG. 2, shows in the same simplified way, the structure of a triac. This triac is formed from a lightly-doped N-type substrate 1 surrounded with a P-type doped insulating wall 2. The triac can be considered as being formed of two thyristors in anti-parallel. The first thyristor successively includes, from its anode to its cathode, lower layer 3, substrate 1, P-type well 4 and N+-type region 5. The second thyristor includes, from its anode to its cathode, P-type well 4, substrate 1, P-type layer 3 and an N+-type region 7 formed on the lower surface side substantially opposite to the portion of well 4 in which region 5 is not formed. As in the case of the thyristor of FIG. 1, a gate region and a gate contact metallization (not shown) are provided on the upper surface side. A metallization A1 covers the rear surface. A metallization A2 is in contact with N+ region 5 and P well 4. Conventionally, regions 5 and 7 are provided with emitter short-circuits.

The vertical structures of the various shown layers are optimized to obtain desired characteristics of the thyristor or of the triac, especially its sensitivity to voltage variations, sensitivity to current variations, on-state voltage drop, gate turn-on current threshold, breakdown voltage, etc.

However, the reverse biasing breakdown voltage is in practice essentially determined by the component periphery, as will be discussed hereafter.

An object of the present invention is to improve this periphery to optimize the breakdown voltage of a four-layer component such as previously described.

To achieve this and other objects, the present invention provides a 4-layer structure vertical component including a thick lightly-doped area of a first conductivity type determining the breakdown voltage of the component, surrounded with a peripheral wall of the second conductivity type vertically extending from one surface of the component to the other, and a heavily-doped layer of the second conductivity type extending over the entire rear surface of the component. A lightly-doped layer of the second conductivity type extends over the entire component surface at the interface between the lightly-doped thick area of the first conductivity type and the heavily-doped layer of the second conductivity type.

According to an embodiment of the present invention, the component is a triac, including a heavily-doped area of the first conductivity type formed on the rear surface side in the heavily-doped layer of the first conductivity type, in which said lightly-doped layer is interrupted in front of said heavily-doped area.

According to an embodiment of the present invention, the heavily-doped area is provided with emitter short-circuits and portions of the lightly-doped layer are maintained in front of said emitter short-circuits.

The foregoing and other objects, features and advantages of the present invention, will be discussed in detail in the following non-limiting description of specific embodiments in connection with the accompanying drawings, in which.

As usual in the field of semiconductor representation, the various layers are not drawn to scale, neither in their horizontal dimensions, nor in their vertical dimensions.

Figure 1:
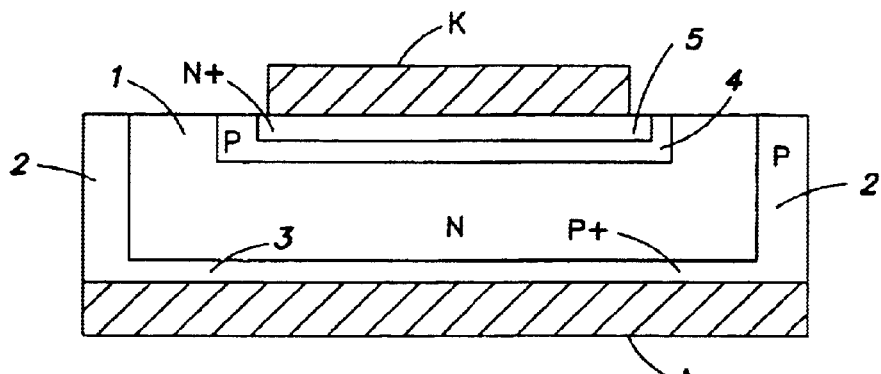
FIG. 1 is a simplified cross-section view of a thyristor.
Figure 2:
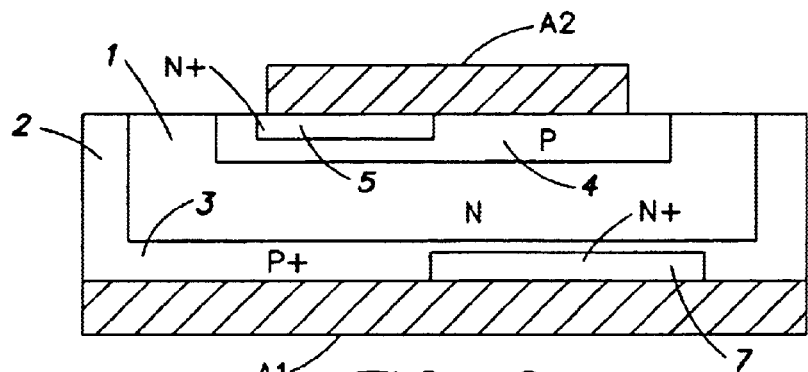
FIG. 2 is a simplified cross-section view of a triac.
Figure 3:
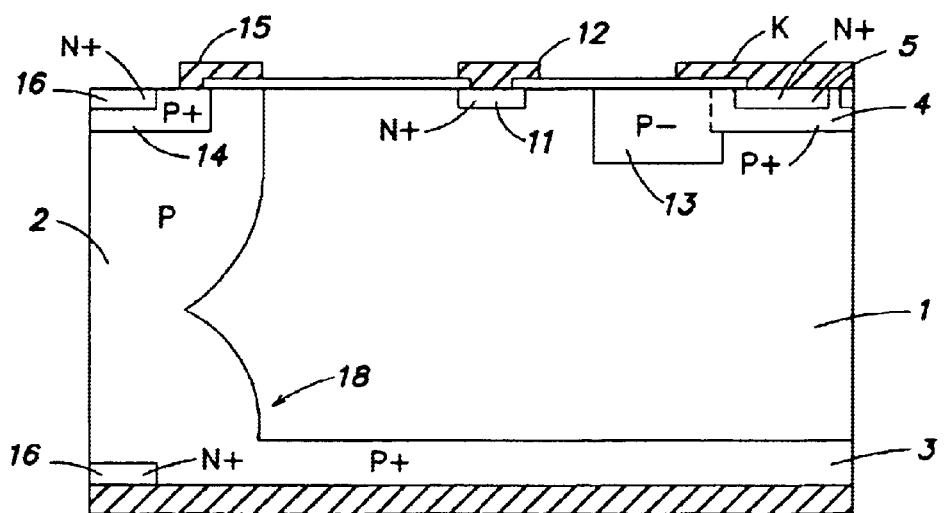
FIG. 3 is a cross-section view of a conventional thyristor/triac periphery structure.

FIG. 3 essentially shows the peripheral portion of a component. To the right of this drawing, the elements constitutive of a thyristor or of a triac are shown, designated by the same references as in FIGS. 1 and 2, that is, from the anode to the cathode, a P-type layer 3 extending over the entire rear surface, a lightly-doped N-type substrate 1, a P-type well 4 and a heavily-doped N-type region 5, within which an emitter short-circuit hole has been shown. The component periphery is occupied by an insulating wall 2 generally formed by drive-in from the upper and lower surfaces of the substrate.

The first precaution to be taken to have a satisfactory breakdown voltage in reverse biasing is that the lateral distance between the limit of P-type insulating wall 2 and P-type region 4 on the upper surface side of the substrate is at least equal to the thickness of substrate 1. Further, a channel stop region 11 coated with a metallization 12 possibly extending inwards to form a field plate is generally provided. P-type region 4 may be surrounded with a lightly-doped P-type ring 13. A contact may be taken on a more heavily-doped portion 14 of the upper surface of wall 2, by a metallization 15 which comes back towards the inside of the component and also forms a field plate. N+ regions 16 formed at the component periphery and heavily doped with phosphorus are used as getters. As can be seen, conventional means for increasing the breakdown voltage of a component are essentially provided to reduce the probability for breakdowns to occur at the level of the upper substrate surface. Indeed, this upper surface is a priori the most sensitive, the component sides (wall 2) and bottom (layer 3) forming a same equipotential surface.

However, whatever precautions are taken, a breakdown inevitably occurs at a given voltage. To increase the breakdown voltage, various solutions have been provided.

A first solution consists of increasing the substrate resistivity (decreasing its doping level), but then, the on-state resistance (Ron) of the component increases, and the sensitiveness to triggerings due to abrupt variations of the current (di/dt) upon switchings also increases.

Another solution consists of increasing the distance between the limit of the active portions (P region 4) and the insulating wall. This of course has the disadvantage of increasing the chip surface area.

Another solution consists of forming a lightly-doped P-type region at the internal periphery of the upper surface of the insulating wall, similarly to region 13. This solution, like the former, results in an increase in the chip surface area.

Further, despite their disadvantages, these last two solutions have not brought remarkable advantages in terms of breakdown voltage. Accordingly, the applicant has once again analyzed the reverse breakdown phenomenon of the structure and has performed various tests and simulations to check the hypothesis made. Thus, the applicant has considered that the reverse breakdown essentially occurs due to the marked curvature of the field lines in region 18 corresponding to the intersection between insulating wall 2 and lower surface P-type layer 3.

Figure 4:
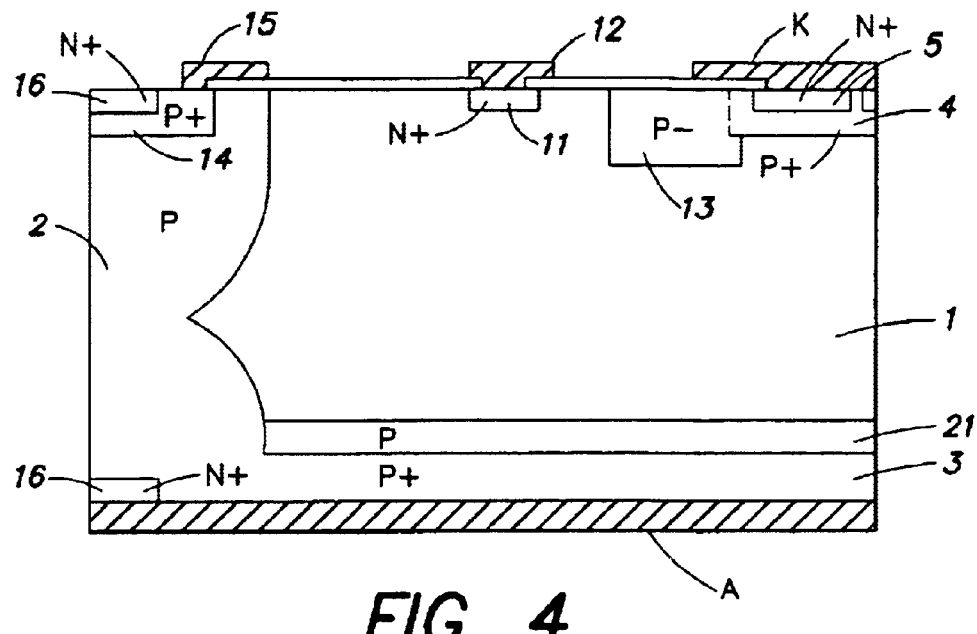
FIG. 4 is a cross-section view of a structure of the periphery of a thyristor/triac according to the present invention.

To solve this problem, as shown in FIG. 4, the present invention provides forming a lightly-doped P-type layer 21 at the interface between lightly-doped N-type substrate 1 and heavily-doped rear surface P-type layer 3.

Simulations and tests performed by the applicant show that, when such a layer is used, the breakdown no longer occurs at the component periphery, but in a central area thereof. The maximum possible breakdown voltage linked to the characteristics of the vertical structure of the 4-layer component has thus been obtained. According to an advantage of the present invention, this result is obtained with no surface area increase as compared to the conventional structure of FIG. 3.

In a real example, while a component of the type of that in FIG. 3 without P-type layer 21 has a reverse breakdown voltage on the order of 1,050 volts, a component according to the present invention provided with layer 21 has a breakdown voltage of 1,350 volts, which improvement is greater than 25%.

The only disadvantage of the presence of layer 21 in the case of a thyristor is a slight increase in the on-state voltage drop, which increases from 1.25 to 1.32 volts under 11 amperes, that is, an increase smaller than 5%, which is negligible in practice in most applications.

Figure 5:
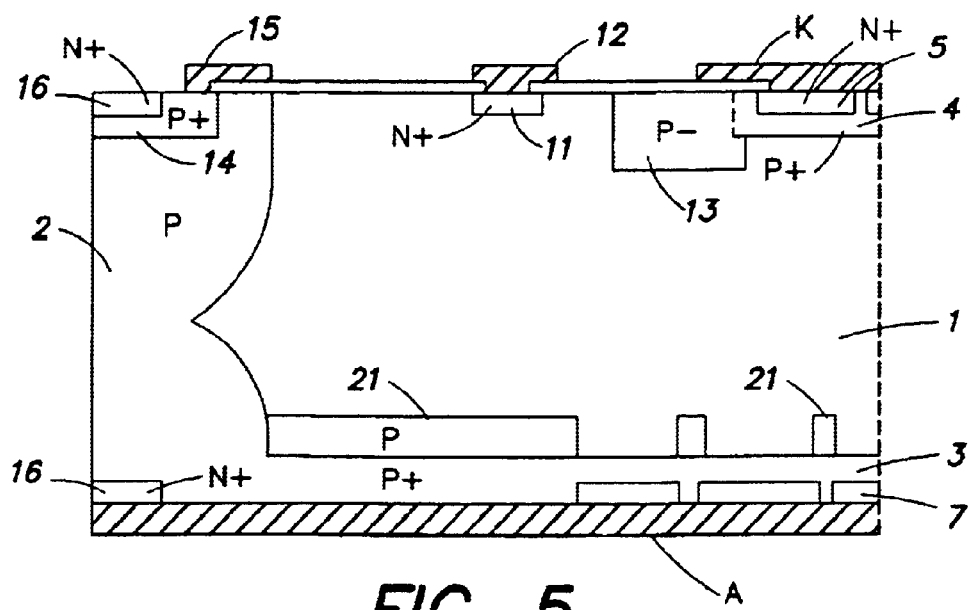
FIG. 5 is a cross-section view of a structure of the periphery of a triac according to an alternative of the present invention.

In the case where the component is a triac, it has appeared that, in addition to this disadvantage, the triac turn-on threshold current in quadrant Q3 (positive electrode A1, negative electrode A2, negative gate) is high. To overcome this disadvantage, according to the present invention, as illustrated in FIG. 5, it is provided to interrupt P-type layer 21 in front of rear surface N-type layer 7, layer 21 remaining only outside areas located above layer 7 (see FIGS. 2 and 5). This solution provides good results, that is, the sensitivity in quadrant Q3 is not visibly altered and the breakdown voltage is 1,220 volts, that is, a 15% increase instead of a 25% increase is obtained.

It should be noted that the inserting of the lightly-doped P-type region according to the present invention does not complicate the structure manufacturing process. Indeed, this P-type region can be formed at the same time as P-type region 13, just after the forming of insulating walls 2. P-type region 13 will for example have a surface concentration of $10^{15}$ atoms/cm$^3$ and a 50-$\mu$m penetration depth.

Of course, the present invention is likely to have various alterations, modifications, and improvements which will readily occur to those skilled in the art. All conductivity types may be inverted. The present invention applies to various alternatives of 4-layer components other than thyristors and triacs. Various improvements currently made to the components may be cumulated with the present invention.

What is claimed is:

1. A 4-layer structure vertical component including a thick lightly-doped area of a first conductivity type determining a breakdown voltage of the component, surrounded with a peripheral wall of a second conductivity type vertically extending from one surface of the component to the other, a heavily-doped layer of the second conductivity type extending over an entire rear surface of the component, and a lightly-doped layer of the second conductivity type extending over an entire component surface at the interface between the lightly-doped thick area of the first conductivity type and the heavily-doped layer of the second conductivity type, forming a triac, including a heavily-doped area of the first conductivity type formed on the rear surface side in the heavily-doped layer of the first conductivity type, wherein said lightly-doped layer is interrupted in front of said heavily-doped area.

2. The component of claim 1, wherein the heavily-doped area is provided with emitter short-circuits and wherein portions of the lightly-doped layer are maintained in front of said emitter short-circuits.

3. A vertical semiconductor component comprising:

a lightly-doped substrate of a first conductivity type;

a peripheral wall of a second conductivity type surrounding the substrate and extending from a front surface to a rear surface of the component;

a heavily-doped layer of the second conductivity type on the rear surface of the component; and a lightly-doped layer of the second conductivity type between the substrate and the heavily-doped layer of the second conductivity type, comprising a triac including a region of the first conductivity type formed in a well of the second conductivity type on the front surface of the component and a region of the first conductivity type formed in the heavily-doped layer of the second conductivity type.

4. A vertical semiconductor component as defined in claim 3, wherein the lightly-doped layer of the second conductivity type is interrupted near the region of the first conductivity type on the rear surface of the component.

5. A vertical semiconductor component as defined in claim 4, wherein the region of the first conductivity type on the rear surface of the component is provided with emitter short circuits and wherein the lightly-doped layer of the second conductivity type is maintained adjacent to the emitter short circuits.

* * * * *

UNITED STATES PATENT AND TRADEMARK OFFICE
CERTIFICATE OF CORRECTION

PATENT NO. : 6,967,356 B2
DATED : November 22, 2005
INVENTOR(S) : Gérard Auriel

It is certified that error appears in the above-identified patent and that said Letters Patent is hereby corrected as shown below:

Column 1,
Between lines 2 and 3, insert
-- Background Of The Invention
1.   Field of the Invention --.
Between lines 7 and 8, insert
-- 2.   Discussion of the Related Art --.
Between lines 45 and 46, insert
-- Summary Of The Invention --.

Column 2,
Between lines 8 and 9, insert
-- Brief Description Of The Drawings --.
Between lines 17 and 18, insert
-- Detailed Description --.

Column 4,
Between lines 6 and 7, insert
-- Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto. --.

Signed and Sealed this

Fourteenth Day of February, 2006

JON W. DUDAS
*Director of the United States Patent and Trademark Office*